United States Patent
Meissner et al.

(10) Patent No.: US 8,907,210 B2
(45) Date of Patent: Dec. 9, 2014

(54) SEMICONDUCTOR MATERIAL AND ITS APPLICATION AS AN ABSORBER MATERIAL FOR SOLAR CELLS

(75) Inventors: Dieter Meissner, Wels (AT); Mare Altosaar, Tallinn (EE); Enn Mellikov, Harjumaa (EE); Jaan Raudoja, Tallinn (EE); Kristi Timmo, Tallinn (EE)

(73) Assignee: crystalsol OÜ, Tallinn (EE)

( * ) Notice: Subject to any disclaimer, the term of this patent is extended or adjusted under 35 U.S.C. 154(b) by 765 days.

(21) Appl. No.: 13/054,200

(22) PCT Filed: Jul. 15, 2009

(86) PCT No.: PCT/EE2009/000011
§ 371 (c)(1),
(2), (4) Date: Dec. 5, 2011

(87) PCT Pub. No.: WO2010/006623
PCT Pub. Date: Jan. 21, 2010

(65) Prior Publication Data
US 2012/0138136 A1    Jun. 7, 2012

Related U.S. Application Data

(60) Provisional application No. 61/080,836, filed on Jul. 15, 2008.

(30) Foreign Application Priority Data

Jul. 15, 2008 (DE) ................... 20 2008 009 492 U

(51) Int. Cl.
| | |
|---|---|
| *H01L 31/0264* | (2006.01) |
| *H01L 31/0272* | (2006.01) |
| *H01L 27/142* | (2014.01) |
| *H01L 29/04* | (2006.01) |
| *H01L 31/032* | (2006.01) |

(52) U.S. Cl.
CPC ............. *H01L 31/0326* (2013.01); *Y02E 10/50* (2013.01)
USPC ........... 136/265; 136/250; 136/260; 136/261; 136/264

(58) Field of Classification Search
CPC ....... H01L 27/142; H01L 29/04; H01L 29/12; H01L 31/0264; H01L 31/0272
USPC ......... 136/205, 206, 238, 239, 241, 244, 250, 136/260, 261, 264, 265
See application file for complete search history.

(56) References Cited

FOREIGN PATENT DOCUMENTS

WO    99/67449    12/1999

OTHER PUBLICATIONS

M. Altosaar, et al., "$Cu_2Zn_{1-x}Cd_xSn(Se_{1-y}S_y)_4$ solid solutions as absorber materials for solar cells", Physica Status Solidi A, vol. 205, No. 1, pp. 167-170, Jan. 15, 2008.
E. Mellikov, et al., "Monograin materials for solar cells", Solar Energy Materials and Solar Cells, vol. 93, No. 1, pp. 65-68, Jun. 10, 2008.
M. Altosaar, et al., "$Cu_2ZnSnSe_4$ Monograin Powders for Solar Cell Application", Photovoltaic Energy Conversion, Conference Record of the 2006 IEEE $4^{th}$ World Converence On, IEEE, PI, pp. 468-470, May 1, 2006.
Hiroaki Matsushita et al., "Crystal Growth and Characterization of CU-Based Quaternary Compounds With Chalcopyrite-Like Structure for Thin Film Solar Cells", $21^{st}$ European Photovoltaic Solar Energy Conference, Dresden, Germany, pp. 2018-2022, Sep. 4, 2006.
International Search Report corresponding to International Application No. PCT/EE2009/000011, dated Jan. 25, 2010.

*Primary Examiner* — Susan D Leong
(74) *Attorney, Agent, or Firm* — Renner, Otto, Boisselle, & Sklar, LLP

(57) ABSTRACT

This invention describes a semiconductor material of general formula (I) Me12Me21-xMe3xMe4(C11-yC2y)4, in which x stands for a numeric value from 0 to 1, and y stands for a numeric value of 0 to 1, as well as its use as an absorber material in a solar cell. The metal Me1 is a metal which is selected from the metals in group 11 of the periodic table of the elements (Cu, Ag or Au). The metals Me2 and Me3 are selected from the elements of the 12th group of the periodic table of elements (Zn, Cd & Hg). The metal Me4 is a metal which is selected from the 4th main group of the periodic table of elements (C, Si, Ge, Sn and Pb). The non-metals C1 and C2 are selected from the group of chalcogenides (S, Se and Te).

17 Claims, No Drawings

SEMICONDUCTOR MATERIAL AND ITS APPLICATION AS AN ABSORBER MATERIAL FOR SOLAR CELLS

This application is a national phase of International Application No. PCT/EE2009/000011 filed Jul. 15, 2009 and published in the English language.

The present invention concerns a semiconductor material as well as solar cells, which include this semiconductor material as an absorber material.

In the light of the looming shortage of resources and of the climatic problems in connection with the combustion of fossil energy carriers, there is a strong interest in generating power by using renewable sources of energy. Using solar energy represents an important field in connection with this. Today, almost exclusively semiconductor solar cells are used for direct transformation of solar energy into electric energy by using photovoltaic solar cells.

Solar cells from semiconductor materials are basically designed like large area photo diodes. They are not used as radiation detectors, but as a current source, in this case.

The particularity of semiconductors is that they generate free charge carriers (electrons and holes) caused by the absorption of energy (electromagnetic radiation). For generating an electric current from these charges, an internal electric field is required in order to guide the generated charge carriers in different directions.

This internal electric field is in most cases created by a p-n junction. Since the light intensity is usually exponentially decreasing inside materials, this junction must be located as near as possible to the surface, and the transitional zone in connection with the electric field should reach as far as possible into the material. This transitional zone (space charge layer) is set up by targeted material doping. In order to create the desired profile, a thin surface layer is usually heavily n-doped, and the thick layer underneath is slightly p-doped. This causes a space charge layer. If photons now penetrate this transition zone and generate electron-hole pairs (photo effect), or if electron-hole pairs created outside of the space charge layer diffuse into this zone, the holes will be accelerated by the electric field towards the p-material on the bottom, and vice versa, the electrons will be accelerated towards the n-contact on the top side (which is directed to the sun). A portion of these charge carriers recombine on their way and get lost in the form of heat, but the remaining current (photovoltaic current) can either directly be used by a consumer, intermediately stored in a rechargeable battery, or supplied into the power grid by using a grid controlled power inverter. The electric voltage with maximum power is usually at approx. 0.5 V for the most common cells.

A disadvantage of this well-known solar cell type is that the semiconductor materials used generally include silicon (Si), indium (In, for instance in form of $CuInSe_2$, CIS, or $Cu(In_xGa_{1-x})Se_2$, CIGS), as well as tellurium (in form of CdTe). Silicon is a bad light absorber and must be manufactured with utmost purity levels, which makes this material expensive and requires a lot of energy for its production. In case of the rare metals of indium and tellurium, the worldwide consumption (with indium approximately 850 tons and with tellurium approximately 135 tons) today exceeds the annual production volume by a multitude, so that problems concerning the purchasing of sufficient amounts of indium and tellurium materials will arise in the foreseeable future. Additionally, costs for purchasing of corresponding indium and tellurium sources are very high.

Moreover, the materials, which we know from the state of the art in technology as absorber media for solar cells, have the disadvantage of being basically manufactured by sputtering techniques or physical vapour deposition (PVD), and therefore usually have an inhomogeneous structure, especially with larger areas.

For this reason, the first task of the present invention is dealing with the challenge of providing an absorber material for solar cells, which generally does not require the use of cost intensive primary materials in manufacture.

Additionally, the current invention is dealing with the task of providing an absorber material for solar cells, the primary or raw materials for which are preferably available in sufficient quantities.

Furthermore, the current invention is dealing with the task of providing an absorber material for solar cells, which preferably has a more homogeneous structure than the semiconductor materials known from the state of the art in technology.

Another task of the present invention is to provide a solar cell, which includes the desired semiconductor material as an absorber material.

The described task is in its first aspect of the present invention solved by using a semiconductor material of the general formula (I)

$$Me1_2Me2_{1-x}Me3_xMe4(C1_{1-y}C2_y)_4 \qquad (I),$$

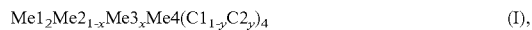

where Me1, Me2, and Me4 are selected from the group of metals including the group of transition metals, C1 and C2 are nonmetals, and where x in the general formula (I) stands for a numeric value of 0 to 1 and y for a numeric value of 0 to 1.

According to the present invention it was found that the semiconductor material mentioned above is suitable as an absorber material in solar cells. Additionally, the primary materials used for manufacturing the semiconductor material according to the present invention are available in sufficient quantities and are, furthermore, cost efficiently available, so that it can cost efficiently be produced in an easy way and in large quantities. The use of expensive and rarely found primary materials is no longer required. Moreover, the material according to the present invention can be manufactured by using a method which is described below, and which leads—compared with semiconductor materials of the state of the art—to a more homogeneous structure of the semiconductor material.

In a first preferred embodiment of the present invention, the metal Me1 is a metal, which is selected from the metals in group 11 of the periodic table of the elements (Cu, Ag or Au).

In a second preferred embodiment of the present invention, the metals Me2 and Me3 are selected from the elements of the 12th group of the periodic table of the elements (Zn, Cd and Hg).

In a third preferred embodiment of the present invention, the nonmetals C1 and C2 are selected from the group of chalcogenides (S, Se and Te).

In a fourth preferred embodiment of the present invention, a metal from the 4th main group of the periodic table of the elements (C, Si, Ge, Sn and Pb), in particular Sn, is selected as metal Me4.

In a fifth preferred embodiment of the present invention,
(1) the metal Me1 is selected from the group consisting of the metals of group 11 of the periodic table of the elements (Cu, Ag and Au); and
(2) the metals Me1 and Me2 are selected from the group consisting of the elements of the 12th group of the periodic table of the elements (Zn, Cd and Hg); and
(3) the nonmetals C1 and C2 are selected from the group consisting of the chalcogenides (S, Se and Te); and (4) the metal Me4 is selected from the 4th main group of the periodic table of the elements (C, Si, Ge, Sn and Pb), where in particular Sn is selected.

In a particularly preferred embodiment of the present invention, the semiconductor material according to the present invention has the general formula (Ia)

$$Cu_2Zn_{1-x}Cd_xSnSe_4 \qquad (Ia),$$

in which x stands for a numeric value from 0 to 1, where the numeric values of 0.3 to 0.7 are particularly preferred.

In another, particularly preferred embodiment of the present invention, the semiconductor material according to the present invention has the general formula (Ib)

$$Cu_2ZnSn(Se_{1-y}S_y)_4 \qquad (Ib),$$

in which y stands for a numeric value from 0 to 1, and where the numeric values of 0.3 to 0.7 are particularly preferred.

The semiconductor material according to the present invention is crystalline and is preferably present in form of monocrystals, i.e., in a single crystalline form.

The semiconductor according to the present invention preferably has a tetragonal or (spseudo) cubic structure. An X-ray analysis of the semiconductor material according to the present invention moreover shows, that a stannite and/or kesterite structures are present.

The semiconductor material according to the present invention can be obtained from the method described below, which at least partially takes place in a melt. A corresponding manufacturing method is described in WO 99/67449 A, the entire disclosure of which with respect to the subject of this invention is included in the present invention by referencing.

Therefore, within the scope of this invention, a semiconductor material gained from a melt is moreover preferred. The advantage associated with this method is generally based on the improved homogeneity of the resulting semiconductor material.

Furthermore, a semiconductor material is preferred which is gained by isothermal recrystallisation from the melt.

The present invention furthermore concerns a semiconductor material gained in accordance with a method, in which
(1) CuSe(S), ZnSe(S), CdSe(S) and SnSe(S) precursor compounds are mixed with each other in a first process step of this method ;
(2) the mixture obtained from process step (1) is milled;
(2) the mixture obtained from process step (2) is degassed; and
(4) the mixture obtained from process step (3) is heated in an enclosed unit to a temperature of preferably 400 to 900° C., preferably of 450 to 850° C., with a range of 500 to 800° C. being particularly preferred in this case.

With this method, a semiconductor material with the general formula (I)

$$Me1_2Me2_{1-x}Me3_xMe4(C1_{1-y}C2_y)_4 \qquad (I),$$

where Me1, Me2, Me3 and Me4 are selected from the group of metals including the group of transition metals, C1 and C2 are nonmetals, and where x in the general formula (I) stands for a numeric value of 0 to 1 and y for a numeric value of 0 to 1, is preferably obtained.

Therefore, the stoichiometric ratio of the corresponding precursor compounds in process step (1) is preferably selected in such a way, that the desired target compound according to general formula (I) is obtained.

In particular, the stoichiometric ratio of the corresponding precursor compounds in the mix is selected in such a way, that a penternary (consisting of 5 components) or hexanary (consisting of 6 components) material according to the general formula $$Cu_2Zn_{1-x}Cd_xSn(Se_{1-y}S_y)_4 \qquad (II)$$

results, in which x stands for a numeric value from 0 to 1, and y stands for a numeric value of 0 to 1.

The semiconductor material is preferably obtained according to the method described above, whereby the growth in the melt is performed in a medium of, for instance, potassium iodide or sodium chloride in process step (4).

The semiconductor material is preferably obtained from the method described above, whereas the milling of the mixture in process step (2) can be performed by using a planetary mill.

Moreover, the semiconductor material is preferably obtained as a monocrystalline powder with particle diameters of between 1 μm and 3 mm, with diameters of between 10 μm and 100 μm are being particularly preferred. In this form it is particularly well suited for use in monograin membranes.

The semiconductor material is preferably obtained according to the method described above, in which the material can be heated in process step (4) for a period of between 10 sec and 100 h, preferably of between 10 min and 10 h, and where a period of between 10 min and 2 h is particularly preferred.

The semiconductor material is preferably obtained according to the method described above, in which the semiconductor material is manufactured in the presence of an inert gas. A noble gas can preferably be used as the inert gas. In particular, argon gas is used as the inert gas.

The semiconductor material according to the present invention and obtained in the described way, is preferably present in form of a monocrystalline structure.

A further claim of the present invention concerns a solar cell comprising a semiconductor material according to the present invention as the absorber material.

In detail, the present invention concerns a solar cell with an irradiation side, which is designated for the irradiation of light to be transformed into electric power, and with a rear side located opposite to the irradiation side, as well as including a semiconductor layer, in which this semiconductor layer is provided with a p-n coating (p-n junction) as the boundary layer, and is arranged between two electrodes, which can be provided with contacts and are separated by an electric insulator.

The solar cell according to the present invention, in this case, preferably includes a monograin layer having a semiconductor material of the general formula (I)

$$Me1_2Me2_{1-x}Me3_xMe4(C1_{1-y}C2_y)_4 \qquad (I),$$

where Me1, Me2, Me3 and Me4 are selected from the group of metals including the group of transition metals, C1 and C2 are nonmetals, and where x in the general formula (I) stands for a numeric value of 0 to 1 and y for a numeric value of 0 to 1.

Under the scope of the present invention, the solar cell mentioned above in particular includes a monograin layer consisting of $$CdS/Cu_2Zn_{1-x}Cd_xSn(Se_{1-y}S_y)_4,$$

in which x stands for a numeric value from 0 to 1, and y stands for a numeric value of 0 to 1. The semiconductor material according to the present invention preferably is present with a coating of CdS in this monograin layer.

The semiconductor material according to the present invention can in form of this monograin layer be used in a solar cell according to the present invention in combination with a TCO as conductive front contact. The TCO can be of organic or inorganic nature, and for instance be made from PEDOT/PSS, nano tubes, ITO and Al-doped ZnO). The rear contact of the solar cell according to the present invention preferably has good conductivity and can for example consist of graphite, molybdenum, gold, silver, copper and/or aluminium.

The monograin layer under the scope of the solar cell according to the present invention has a filling factor of preferably 40 to 90%, with 45 to 85% being preferred, and 55 to 80% being particularly preferred, whereas high filling factors are beneficial since they allow to achieve a higher performance at the operating point.

The barrier voltage required for a p-n junction of the mono layer in general amounts to between 0.3 and 2 eV, with 0.5 to 1.5 eV being preferred, and 0.7 to 1.4 eV being particularly preferred.

The solar cell according to the present invention has an open circuit voltage of preferably 0.2 to 1.8 V, with 0.5 to 1.6 V being the preferred, and 0.7 to 1.3 V being the particularly preferred range.

The solar cell according to the present invention is preferably obtainable according to a process method in which an absorber material having the structure $$Me1_2Me2_{1-x}Me3_xMe4(C1_{1-y}C2_y)_4,$$

and in which Me1, Me2, Me3, Me4, C1, C2, x and y have the meanings mentioned above, (1) is coated with a thin film of CdS in a first process step;
(2) where the absorber material obtainable from process step (1) is introduced in the thin film of a non-hardened polymer in a second process step;
(3) and the polymer is then hardened in a third process step;
(4) in which on top of the polymer resulting from process step (3) areas are coated with a transparent conductor, preferably with a well conductive and transparent oxide (TCO), exemplary with ITO or an Al-doped ZnO in a fourth process step;
(5) where the solar cell obtained from process step (4) is provided with one or more rear contact(s), and
(6) where the solar cell obtained from process step (5) is connected with the contacts.

The thin film generation in process step (1) is preferably performed in such a way that the powder material is briefly immersed in a solution of colloidal CdS or sprayed with this solution.

The corresponding solar cells have an efficiency factor of preferably 3 to 29%, with 5 to 29% being preferred and 10 to 29% being particularly preferred values. Under the efficiency factor, we understand the ratio of the electric power output in relation to the irradiated power under so-called standard conditions (25° C., 1000 W/m² of light power and an AM 1.5 light spectrum).

The invention claimed is:

1. A semiconductor material of the general formula (Ia) or (Ib)

$$Cu_2Zn_{1-x}Cd_xSnSe_4 \quad (Ia), or$$

$$Cu_2ZnSn(Se_{1-y}S_y)_4 \quad (Ib)$$

in which x in the general formula (Ia) and (Ib) stands for a numeric value of 0.3 to 0.7 and y for a numeric value of 0.3 to 0.7.

2. A semiconductor material according to claim 1, in form of monocrystals.

3. A semiconductor material according to claim 1, in form of a powder comprising crystals with diameters of between 2 and 200 μm.

4. A semiconductor material according to claim 1, in form of a powder comprising crystals with diameters of between 5 and 100 μm.

5. A semiconductor material according to claim 1, obtainable according to a method in which the semiconductor material is created in a melt.

6. A semiconductor material according to claim 5, in which the semiconductor material is created by isothermal recrystallisation.

7. A semiconductor material according to claim 5, in which the semiconductor material is created by isothermal recrystallisation from the melt.

8. A semiconductor material according to claim 5, wherein
(1) CuSe(S), ZnSe(S), CdSe(S) and SnSe(S) precursor compounds are mixed with each other in a first process step of this method;
(2) the mixture obtained from process step (1) is milled;
(2) the mixture obtained from process step (2) is degassed; and
(4) the mixture obtained from process step (3) is heated in an enclosed unit to a temperature of preferably 400 to 900° C., preferably of 450 to 850° C., with a range of 500 to 800° C. being particularly preferred in this case.

9. A semiconductor material according to claim 8, wherein the stoichiometric ratio of the precursor compounds in process step (1) is selected in such a way that a penternary or hexanary material of the general formula $$Cu_2Zn_{1-x}Cd_xSnSe_4 \quad (Ia), or$$

$$Cu_2ZnSn(Se_{1-y}S_y)_4 \quad (Ib)$$

is obtained, in which x stands for a numeric value from 0.3 to 0.7, and y stands for a numeric value of 0.3 to 0.7.

10. A semiconductor material according to claim 5, wherein the heating in process step (d) is performed over a period of 10 s to 100 h.

11. A semiconductor material according to claim 5, wherein the semiconductor material is manufactured in the presence of an inert gas.

12. A semiconductor material obtainable according to claim 5, in form of monocrystals.

13. A solar cell comprising a semiconductor material in accordance with claim 1 as an absorber material.

14. A solar cell according to claim 13, wherein the semiconductor material is coated with a thin film of CdS.

15. A solar cell according to claim 14, additionally comprising a conductive front contact and a conductive rear contact.

16. A solar cell according to claim 13, wherein the conductive front contact comprises organic or inorganic materials, in particular from PEDOT/PSS, nano tubes, ITO and Al-doped ZnO, and that the rear contact comprises graphite, molybdenum, gold, silver, copper or aluminium.

17. A solar cell obtainable according to a method, in which an absorber material according to claim 1
(1) is coated with a thin film of CdS in a first process step;
(2) the absorber material obtainable from process step (1) is introduced in the thin film of a non-hardened polymer in a second process step;
(3) the polymer then is hardened in a third process step;
(4) on top of the polymer resulting from process step (3) areas are coated with a transparent conductor, preferably with a well conductive and transparent oxide (TCO), exemplary with ITO or an Al-doped ZnO in a fourth process step;
(5) the solar cell obtained from process step (4) is provided with one or more rear contact(s), and
(6) the solar cell obtained from process step (5) is connected with the contacts.

* * * * *